United States Patent
Moe et al.

(10) Patent No.: US 12,314,014 B2
(45) Date of Patent: May 27, 2025

(54) GATED RING OSCILLATOR LINEARIZATION

(71) Applicant: TEXAS INSTRUMENTS INCORPORATED, Dallas, TX (US)

(72) Inventors: Marius Moe, Fetsund (NO); Tarjei Aaberge, Nesøya (NO); Bijit Patel, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/466,027

(22) Filed: Sep. 13, 2023

(65) Prior Publication Data

US 2023/0418238 A1    Dec. 28, 2023

Related U.S. Application Data

(63) Continuation of application No. 17/390,291, filed on Jul. 30, 2021, now Pat. No. 11,762,340.

(51) Int. Cl.
*H03M 1/50*   (2006.01)
*G04F 10/00*  (2006.01)
*H03K 3/03*   (2006.01)

(52) U.S. Cl.
CPC ......... *G04F 10/005* (2013.01); *H03K 3/0315* (2013.01)

(58) Field of Classification Search
CPC .......................... G04F 10/005; H03K 3/0315
See application file for complete search history.

(56) References Cited

U.S. PATENT DOCUMENTS

| | | | |
|---|---|---|---|
| 11,677,404 B1* | 6/2023 | Harush | H03L 7/093 327/159 |
| 2004/0146132 A1* | 7/2004 | Staszewski | H03L 7/095 375/376 |
| 2008/0315959 A1* | 12/2008 | Zhuang | H03C 5/00 331/17 |
| 2015/0280842 A1 | 10/2015 | Mayer et al. | |
| 2018/0091158 A1* | 3/2018 | Sudo | H03L 7/087 |
| 2018/0375519 A1* | 12/2018 | Kerner | H03L 7/07 |
| 2019/0007027 A1* | 1/2019 | Tsutsumi | H03H 9/205 |
| 2020/0007136 A1 | 1/2020 | Caffee et al. | |

* cited by examiner

*Primary Examiner* — Jean B Jeanglaude
(74) *Attorney, Agent, or Firm* — Xianghui Huang; Frank D. Cimino

(57) ABSTRACT

Aspects of the disclosure provide for an apparatus comprising a time-to-digital converter (TDC) and a processor coupled to the TDC. In some examples, the TDC may be configured to receive a signal and generate a measurement result indicating a time between start and stop events of the signal. The processor may be configured to receive the measurement result, compare the measurement result to a target value, and determine a non-linearity model configured to correct a variance of the measurement result from the target value.

20 Claims, 3 Drawing Sheets

GATED RING OSCILLATOR LINEARIZATION

CROSS-REFERENCE TO RELATED APPLICATIONS

This application is a continuation application of U.S. patent application Ser. No. 17/390,291 filed Jul. 30, 2021, which is hereby incorporated by reference.

BACKGROUND

A gated ring oscillator (GRO) based time-to-digital converter (TDC) may measure a time between a start pulse and a stop pulse of a series of multiple signal pulses, or a duration of a single signal pulse, and provide a measurement result as a digital output signal having a value representative of the measured time. A GRO based TDC may be useful to measure time in certain types of electronic devices (e.g., complementary metal-oxide semiconductor (CMOS) devices, phase locked loop (PLL) devices) in which it is advantageous to have a large conversion range (e.g., an output having multiple bits).

SUMMARY

Aspects of the disclosure provide for an apparatus comprising a time-to-digital converter (TDC) and a processor coupled to the TDC. In some examples, the TDC may be configured to receive a signal and generate a measurement result indicating a time between start and stop events of the signal. The processor may be configured to receive the measurement result, compare the measurement result to a target value, and determine a non-linearity model configured to correct a variance of the measurement result from the target value.

Other aspects of the disclosure provide for a method. In some examples, the method includes receiving, by a GRO based TDC, a calibration signal, measuring, by the GRO based TDC, the calibration signal to provide a measurement result, the measurement result including variance from a target value, and processing the measurement result to determine a non-linearity model, the non-linearity model defining the variance of the measurement result from the target value.

Other aspects of the disclosure provide for a method. In some examples, the method includes receiving an operating mode signal, measuring, by a GRO based TDC, the operating mode signal to provide a measurement result, the measurement result including variance from a target value, and processing the measurement result according to a non-linearity model defining the variance of the measurement result from the target value to provide a corrected result.

BRIEF DESCRIPTION OF THE DRAWINGS

The same reference numbers (or other feature designators) are used in the drawings to designate the same or similar (functionally and/or structurally) features.

DETAILED DESCRIPTION

Figure 1:
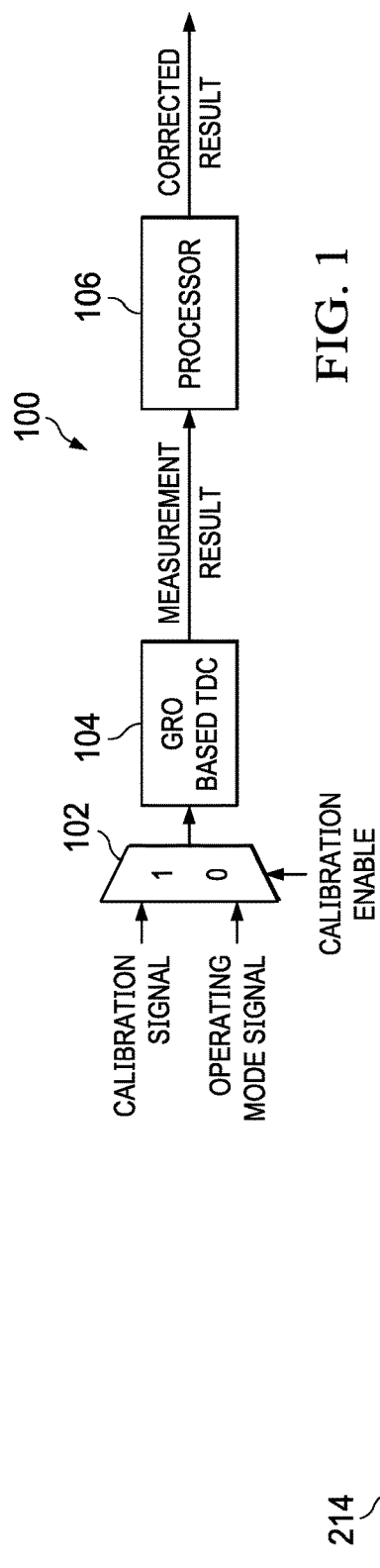
FIG. 1 is a block diagram of a system in accordance with various examples.

A gated ring oscillator (GRO) may have benefits in comparison to other solutions, such as a free-running oscillator. For example, the GRO may consume less power than a free-running oscillator in performing comparable time measurements. The GRO may realize the time savings via a duty cycle that is smaller than that of a free-running oscillator. However, use of the GRO may introduce additional challenges, such as causing ripple in a power supply that supplies power to the GRO. The ripple may be caused by the GRO drawing non-constant, pulse-like current from the power supply. The ripple may cause a response time of the GRO to vary, causing a resolution of the GRO to become more coarse as time progresses through a measurement. The change in speed of the GRO may cause non-linearities in a measurement result of the GRO. The non-linearities may cause errors in values of the measurement result, which may increase as measurement time of the GRO increases.

Aspects of this disclosure provide for estimating and correcting non-linearities in a measurement result of a GRO. In some examples, a series of programmed pulses may be provided to a GRO. The pulses may be arranged in pairs, such as start/stop pairs. In other examples, the pulses may be individual pulses. A time between the start/stop pulses, or a duration of a single pulse, may vary. For example, each pulse, or at least some pulses, may have a different duration compared to other pulses. In some examples, the duration is a function of another signal, such as a clock signal, for example a function of a number of periods of the clock signal.

The GRO may output a measurement result that is a digital signal having a value representative of the duration of the pulse (e.g., the duration of a pulse measured from edge to edge or the time between start/stop pulses). Based on the measurement result, a function may be determined that describes a variation of the measurement result from an ideal, or target, result. For example, the ideal result may be linear in nature (e.g., the ideal measured time may have a 1:1 relationship with the pulse duration) and the actual measurement result may be non-linear. By determining a variation of the measurement result from the ideal result, a function describing the non-linearity of the GRO may be determined. In some examples, an order of the function may be determined according to a number of pulses, or pulse pairs, that are provided to the GRO. For example, in implementations in which the GRO receives 3 pulses, or pulse pairs, the function may be a second order function. In implementations in which the GRO receives 5 pulses, or pulse pairs, the function may be a fourth order function. More generally, in implementations in which the GRO receives N pulses, or pulse pairs, the function may be an N−1 order function.

Subsequent to determining the function describing the non-linearity of the GRO, the function may be applied to measurement results of the GRO to correct for the non-linearities of the GRO. For example, the function describing the non-linearity of the GRO may be determined during a calibration operation, or calibration mode of operation, of the GRO, or a system including the GRO. After determining the function describing the non-linearity of the GRO, the system may enter an operating mode of operation. During the operating mode of operation, the GRO may receive signals for processing to determine measurement results. A processor may receive the measurement results and may apply a correction based on the function describing the non-linearity of the GRO to the measurement results to generate corrected results. In at least some examples, the non-linearities of the measurement results are mitigated to form the corrected results by modifying values of the measurement results according to the function describing the non-linearity of the GRO to form the corrected results. In some examples, the values of the measurement results are modified based on a lookup table generated according to the calibration mode and the function describing the non-linearity of the GRO. In other examples, the values of the measurement results are modified based on multiplication, addition, subtraction, division, or other mathematical operations and polynomial approximation of the non-linearity (e.g., such as the function describing the non-linearity of the GRO).

FIG. 1 is a block diagram of a system 100 in accordance with some examples. In some examples, the system 100 may be representative of a phase locked loop (PLL), or implemented at least partially in a PLL, such that the measurement result may be useful in performing phase error detection and/or time-of-flight measurements in the PLL. The system 100 may include a multiplexer 102, a time-to-digital converter (TDC) 104, and a processor 106. In at least some examples, the multiplexer 102 includes a first input configured to receive a calibration signal. The calibration signal may be a signal having a programmed or known value, such as a signal pulse, pulses, or pulse pairs having programmed timing characteristics. The multiplexer 102 may also include a second input configured to receive a signal to be measured or for measurement, such as a signal pulse, pulses, or pulse pair(s) having an unknown timing characteristic to be measured by the TDC 104. In at least some examples, the signal provided at the second input of the multiplexer 102 is an operating mode signal. The multiplexer 102 may also include a control input at which the multiplexer 102 is configured to receive a calibration enable signal and an output to provide either the calibration signal or the measurement signal based on the calibration mode enable signal. The calibration mode enable signal may be received from any suitable source, such as a processor, a controller, a microcontroller, a state machine, and/or any combination of digital and/or analog components. The output of the multiplexer 102 may be coupled to an input of the TDC 104.

The TDC 104 may include, or may be, a GRO based TDC or other suitable TDC circuit and may include an input to receive a signal selected by the multiplexer 102 for measurement and an output to provide the measurement. The output of the TDC 104 may be coupled to an input of the processor 106, which may have an output. In some examples, the measurement result is provided at the output of the TDC 104. In some examples, the output of the processor 106 may be an output of the system 100 at which the corrected result is provided. While a processor 106 is described herein, in various examples the operations ascribed to the processor 106 may instead be performed by a controller, a digital logic structure, or any other device capable of, and suitable for, performing the operations ascribed herein to the processor 106.

In an example of operation, the system 100 may be capable of operation in a calibration mode and in an operating mode. In at least some examples, the system 100 operates in the calibration mode at startup of the system 100. In other examples, the system 100 operates in the calibration mode at any time responsive to assertion of the calibration enable signal. Based on a value of the calibration enable signal, the multiplexer 102 selects an input from among the calibration signal or the operating mode signal, based on a value of the calibration enable signal. For example, the calibration enable signal being asserted may cause the multiplexer 102 to select the calibration signal. Conversely, the calibration enable signal not being asserted (e.g., being de-asserted) may cause the multiplexer 102 to select the operating mode signal. The multiplexer 102 may provide the selected signal from among the calibration signal or the operating mode signal to the TDC 104.

The TDC 104 may determine and provide a measurement result as a digital signal based on the selected signal received from the multiplexer 102. For example, during operation in the calibration mode, the TDC 104 may receive the calibration signal. The TDC 104 may measure an amount of time passed between start and stop events. For example, the TDC 104 may measure an amount of time between receipt of a rising edge of a first pulse and a falling edge of the first pulse. In another example, the TDC 104 may measure an amount of time between receipt of a rising edge of a first pulse and a rising edge of a second pulse. In another example, the TDC 104 may measure an amount of time between receipt of a rising edge of a first pulse and a falling edge of a second pulse. The TDC 104 may output the measurement result as a digital value that represents the measured time. However, as described above, non-linearities may be introduced into the TDC 104, and therefore the measurement result may differ from the time being measured. The difference may increase as the amount of time between the start and stop events increases. For example, a gain of the TDC 104 may be approximately 100% at a beginning of measurement and may decrease with time. In at least some examples, a gain of the TDC 104 may decrease to about 99.1% for a measurement time of about 400 picoseconds and may further decrease to about 96.1% for a measurement time of about 1600 picoseconds. The non-linearities may be caused by ripples in, or other changes in value of, a power supply coupled to the TDC 104, a temperature in an environment in which the system 100 is implemented, electrical interference in the environment in which the system 100 is operating, an age of the system 100, etc.

The processor 106 may receive the measurement result and, during operation in the calibration mode, determine a non-linearity of the measurement result. For example, ideal performance of the TDC 104, or performance of the TDC 104 in the absence of the non-linearities described herein, may be approximately linear. For example, ideal performance of the TDC 104 may produce digital values between 0 to 200 for a range of measurement times of 0 to 1.6 nanoseconds with the digital value increasing linearly as the time being measured increases. Based on the received measurement result, the processor 106 may determine a variance of the measurement result from the ideal performance of the TDC 104. In at least some examples, the variance is, or is representative of, a non-linear decay. The processor 106 may represent the variance of the measurement result from the ideal performance of the TDC 104 as a mathematical non-linearity function, such as a polynomial function, that describes a correction that may be applied to a given measurement by the TDC 104 so that the corrected measurement is linear with respect to the signal being measured. In at least some examples, an order of the polynomial function may be determined based on a number of pulses, or pulse pairs, provided to the TDC 104 in the calibration signal. After determining the non-linearity function, subsequent measurement results may be corrected by applying a correction according to the non-linearity function to mitigate effects of the non-linearities of the TDC 104 on the measurement result. In some examples, the processor 106 stores the non-linearity function and/or a set of corrections in an internal storage of the processor 106, such as a cache, random access memory (RAM), or other internal storage device of the processor 106. In other examples, the processor 106 may store the non-linearity function and/or corrections in an external storage device (not shown).

For example, during operation in the operating mode, the multiplexer 102 may receive the calibration enable signal having a de-asserted value and, consequently, may provide the operating mode signal to the TDC 104. The TDC 104 may determine and provide the measurement result in a manner substantially similar to that as described above. The processor 106 may receive the measurement result and may modify the measurement result according to the non-linearity function to provide a corrected result. In other examples, the processor 106 may determine and provide a look-up table based on the non-linearity function, where the look-up table includes data indicating an estimated amount of variance of the measurement result from ideal performance for various measurement times. Based on the look-up table, the processor 106 may determine an amount of correction to apply to a measurement result and apply the correction to the measurement result to provide the corrected result.

In another example, a correction circuit (not shown) may be coupled to the TDC 104 and configured to receive the measurement results and modify the measurement results to provide the corrected results. The correction circuit may be a hardware circuit having an architecture suitable for performing mathematical operations such as addition, subtraction, multiplication, and/or division. The correction circuit may be coupled to the processor 106 and configured to receive signals from the processor 106 to control operation of the correction circuit, such as to provide the non-linearity function to the correction circuit and/or to provide operands to the correction circuit for use in providing the corrected results.

Figure 2:
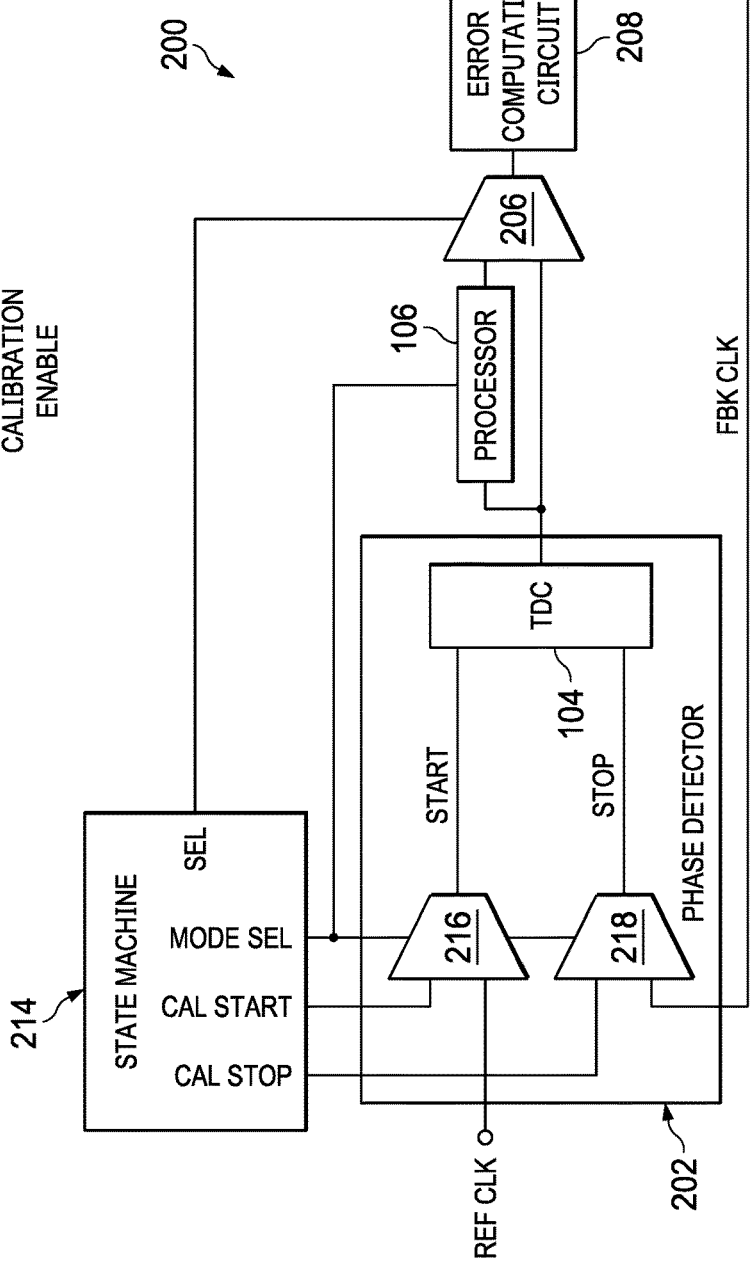
FIG. 2 is a block diagram of a phase locked loop in accordance with various examples.

FIG. 2 is a block diagram of a PLL 200 in accordance with some examples. In at least some examples, the PLL 200 is configured to synchronize a feedback clock (FBKCLK) with a reference clock (REFCLK). The PLL 200 may be said to be in sync, or "locked" when a phase difference between FBKCLK and REFCLK is zero. In at least some examples, the PLL 200 includes a phase detector 202, the processor 106, a multiplexer 206, an error computation circuit 208, a filter 210, an oscillator 212, and a state machine 214. In some examples, the phase detector 202 includes a multiplexer 216, a multiplexer 218, and the TDC 104.

In an example architecture of the PLL 200, the phase detector 202 is adapted to receive REFCLK from any suitable component, the scope of which is not limited herein. An output of the phase detector 202 is coupled to an input of the processor 106 and to a second input of the multiplexer 206. An output of the processor 106 is coupled to a first input of the multiplexer 206. An output of the multiplexer 206 is coupled to an input of the error computation circuit 208 and an output of the error computation circuit 208 is coupled to an input of the filter 210. An output of the filter 210 is coupled to an input of the oscillator 212. In at least some examples, an output of the oscillator 212 is an output of the PLL 200. In some examples, the output of the oscillator 212 is coupled to an input of the phase detector 202.

The state machine 214 may be implemented using any suitable hardware or software device, such as a processor, a controller, a digital logic circuit, etc. The state machine 214 includes a calibration stop output configured to provide a calibration stop signal (CALSTOP), a calibration start output configured to provide a calibration start signal (CAL-START), a mode selection output configured to provide a mode selection signal (MODESEL), and a select signal output configured to provide a select signal (SEL).

In some examples, the multiplexer 216 has a first input coupled to the CALSTART output, a second input adapted to receive REFCLK, and an input selection input coupled to the MODESEL output. The multiplexer 218 has a first input coupled to the CALSTOP output, a second input coupled to the output of the oscillator 212 and adapted to receive FBKCLK, and an input selection input coupled to the MODESEL output. An output of the multiplexer 216 is configured to provide a start signal (START) and is coupled to a first input of the TDC 104. An output of the multiplexer 218 is configured to provide a stop signal (STOP) and is coupled to a second input of the TDC 104. An output of the TDC 104 may be the output of the phase detector 202, as described above.

In an example of operation, the state machine 214 is configured to control whether the phase detector 202 is operating in the calibration mode or the operating mode. For example, the state machine 214 may provide MODESEL having a first value (e.g., such as a value of logical zero) to cause the phase detector 202 to operate in the calibration mode and may provide MODESEL having a second value (e.g., such as a value of logical one) to cause the phase detector 202 to operate in the operating mode. Based on START and STOP, the TDC 104 determines, and provides at its output, a digital code representative of a measurement result of a time difference between assertion of START and assertion of STOP. The processor 106 may receive the digital code provided by the TDC 104 and correct for, or mitigate, non-linearity represented in the digital code. In some examples, the processor 106 corrects for the non-linearity based on a non-linearity model to provide a corrected measurement result. The processor 106 may generate, determine, or otherwise provide the non-linearity model based at least partially on the digital code received from the TDC 104 during operation in the calibration mode, as described elsewhere herein.

Based on SEL, the multiplexer 206 may provide the corrected measurement result or the measurement result to the error computation circuit 208. The error computation circuit 208 may compare an output of the multiplexer 206 (e.g., either the measurement result or the corrected measurement result) to an expected, or programmed, measurement result to provide a phase error signal representative of a difference between the output of the multiplexer 206 and the expected measurement result. The filter 210 may filter the phase error signal to provide a control signal to the oscillator 212. Based on the control signal, the oscillator 212 may provide FBKCLK.

Figure 3:
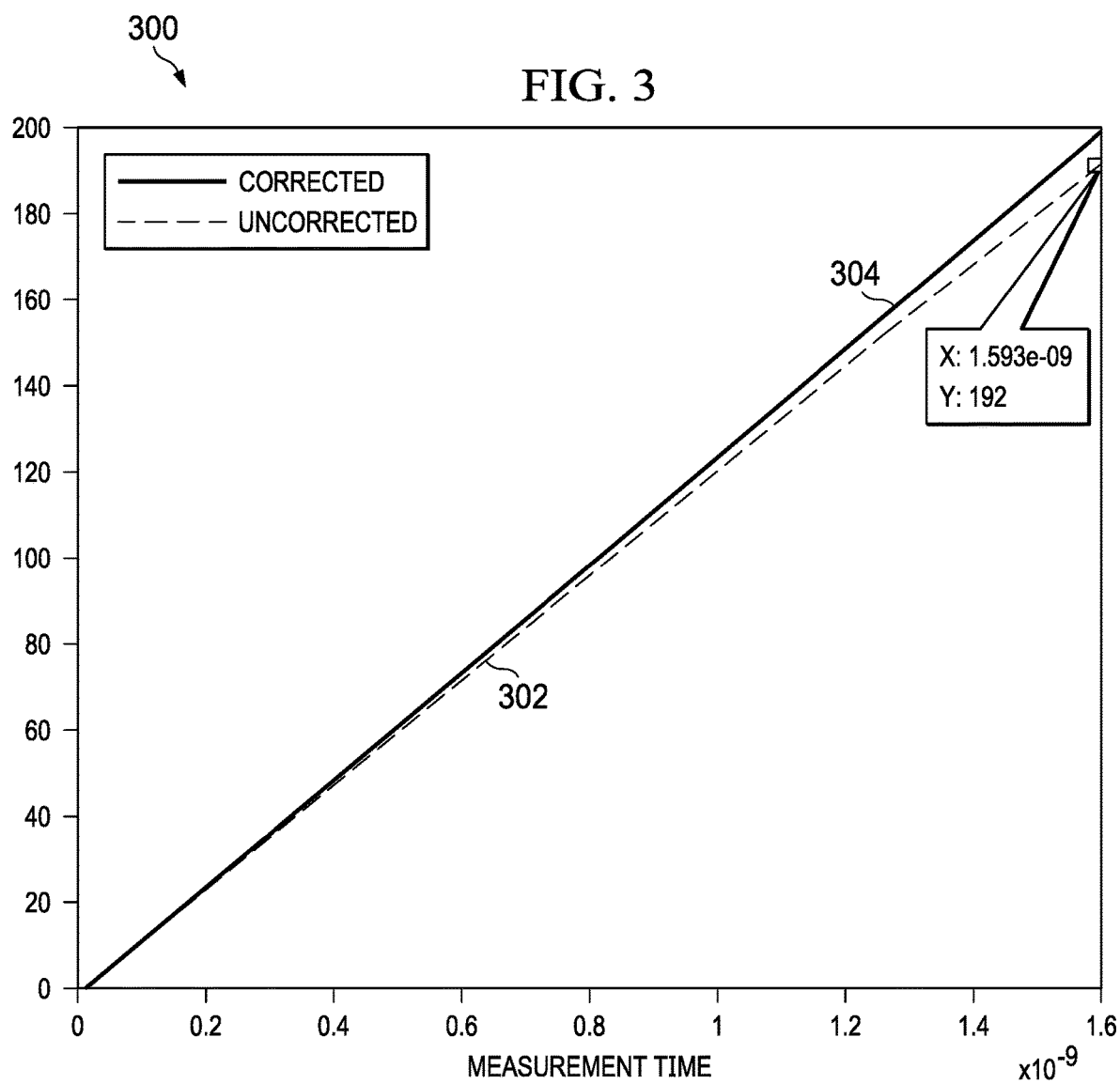
FIG. 3 is a diagram showing measurement results in accordance with various examples.

FIG. 3 is a diagram 300 showing measurement results in accordance with various examples. In at least some examples, the diagram 300 is representative of at least some signals that may be present in the system 100. Accordingly, reference may be made to components and/or signals of the system 100 in describing the diagram 300. A horizontal axis of the diagram 300 is representative of a measurement time of the TDC 104 in units of nanoseconds. A vertical axis of the diagram 300 is representative of a unitless digital value of the measurement result or the corrected result.

As shown in the diagram 300, and described above herein, a value of the measurement result 302 when uncorrected may vary from an ideal value that is linear between a range of measurement times of 0 to 1.6 nanoseconds and measurement results of 0 to 200. In at least one example, the measurement result 302 may have a value of approximately 192 at a measurement time of about 1.6 nanoseconds, varying by 8 from the ideal value of approximately 200 at the measurement time of about 1.6 nanoseconds. As described above, the processor 106 may determine a non-linearity function during operation in the calibration mode based on variance of a measurement result from the ideal, or linear, value. The variance may be caused by, or based on, decay of a measurement result from an ideal, or linear, value. Based on the determined non-linearity function, the processor 106 may process the measurement result 302 to modify the measurement result 302 to form the corrected result 304. The processor 106 may modify the measurement result based on the non-linearity function to form the corrected result according to any suitable process, including use of a look-up table, mathematical operations, or use of a correction circuit, each as described above herein. In at least some examples, the corrected result 304 shown in the diagram 300 is approximately linear, thereby being approximately equal in value to the ideal value.

Figure 4:
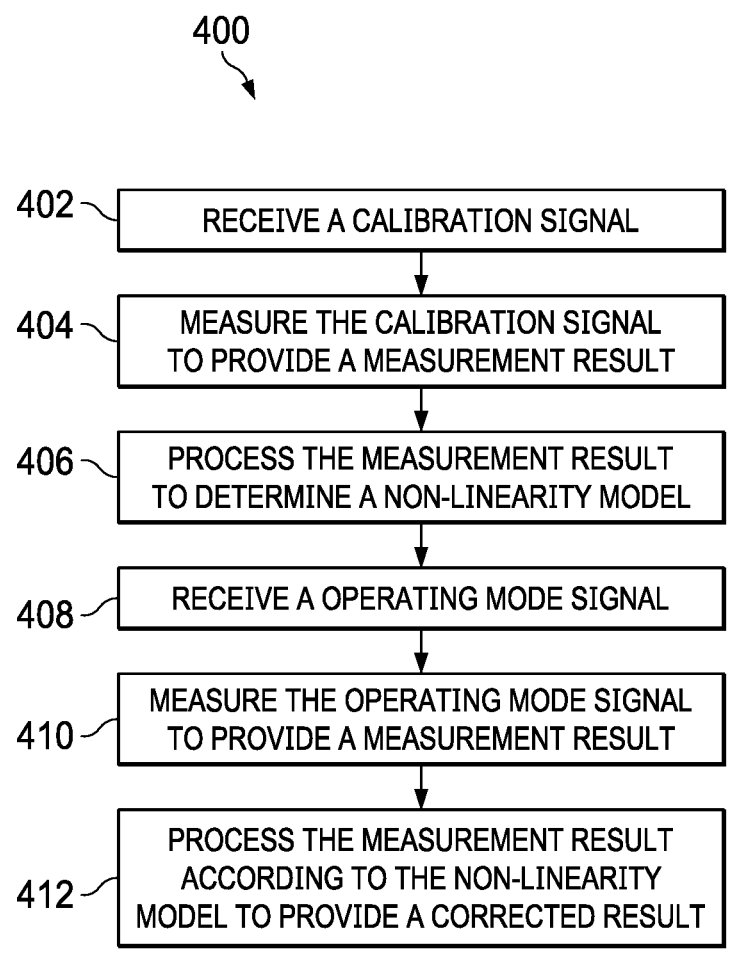
FIG. 4 is a flowchart of a method in accordance with various examples.

FIG. 4 is a flowchart of a method 400 in accordance with various examples. In at least some examples, the method 400 is implemented in a system, such as the system 100. Accordingly, reference may be made to components and/or signals of the system 100 in describing the method 400. In some examples, the method 400 is a method for providing a corrected result of a TDC, such as the GRO based TDC 104. For example, the method 400 may provide for correcting for non-linearities in a measurement result of the TDC based on a determined non-linearity function to form the corrected result.

At operation 402, a calibration signal is received by the TDC. In at least some examples, the calibration signal may be received from a multiplexer or other signal selection circuitry in response to assertion of a calibration enable signal. In some examples, the calibration signal may include a number of signal pulses of varied duration, such as durations that are multiples of a period of a clock signal. In other examples, the calibration signal may include a number of signal pulse pairs temporally spaced at varied durations, such as durations that are multiples of a period of a clock signal.

At operation 404, the calibration signal is measured to provide a measurement result. In at least some examples, the measuring is performed and the measurement result is provided by the TDC. The measurement result is, in some examples, a digital signal including a value or values representing an amount of time between start and stop events of the calibration signal, as described above herein. In some examples, the measurement result includes non-linearities that cause a value of the measurement result to vary from an ideal (e.g., a linear) value. In some examples, an amount of the non-linearity increases as a measurement time of the TDC increases. The non-linearities may cause the measurement result to be inaccurate, adversely affecting operation of a system that receives and/or otherwise relies at least in part on a value of the measurement result.

At operation 406, the measurement result is processed to determine a non-linearity model. In at least some examples, the non-linearity model describes or otherwise defines the non-linearity of the TDC and/or a correction to be applied to the measurement result provided by the TDC to produce a corrected result that varies linearly with the time being measured. The measurement result may be processed by a device, such as a processor, capable of and suitable for comparing the measurement result to the ideal value (e.g., a target value of the measurement result if the measurement result varied linearly with respect to the time being measured) to determine a variance of the measurement result from the ideal value. Based on the variance, the non-linearity model may be determined. In some examples, the non-linearity model is expressed as a polynomial function having an order determined based on a number of pulses included in the calibration signal. In other examples, the non-linearity model is expressed as a look-up table that relates values of the measurement result to the ideal value, defining a variance of the measurement result from the ideal value. In some examples, the variance may be stored in the look-up table as a correction value to be applied to subsequent measurement results to correct for the non-linearities.

At operation 408, an operating mode signal is received. In at least some examples, the operating mode signal may be received from the multiplexer or other signal selection circuitry in response to de-assertion of the calibration enable signal.

At operation 410, the operating mode signal is measured to provide a measurement result. In at least some examples, the measuring is performed and the measurement result is provided by a TDC. The measurement result is, in some examples, a digital signal including a value or values representing an amount of time between start and stop events of the operating mode signal, as described above herein. In some examples, the measurement result includes non-linearities that cause a value of the measurement result to vary from an ideal (e.g., a linear) value. In some examples, an amount of the non-linearity increases as a measurement time of the TDC increases. The non-linearities may cause the measurement result to be inaccurate, adversely affecting operation of a system that receives and/or otherwise relies at least in part on a value of the measurement result.

At operation 412, the measurement result is processed according to the non-linearity model to provide a corrected result. In at least some examples, the corrected result is provided by modifying the measurement result according to a look-up table. In other examples, the corrected result is provided by modifying the measurement result according to the polynomial function, as described above herein. In other examples, the measurement result is processed according to the non-linearity model in any suitable manner to provide a corrected result. For example, in some implementations the corrected result may be provided by a hardware component that includes circuits suitable for performing mathematical operations such as multiplication, addition, subtraction, and/or division to provide the corrected result based on the measurement result and the non-linearity model.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. Circuits described herein are reconfigurable to include the replaced components to provide functionality at least partially similar to functionality available prior to the component replacement. Unless otherwise stated, "about," "approximately," or "substantially" preceding a value means +/−10 percent of the stated value.

Modifications are possible in the described examples, and other examples are possible within the scope of the claims.

What is claimed is:

1. An apparatus comprising:
   a phase detector comprising:
      a time-to-digital converter (TDC); and
      an output coupled to an output of the TDC;
   a processor coupled to the output of the phase detector;
   an error computation circuit coupled to the processor; and
   an oscillator coupled to the error computation circuit and to an input of the phase detector.

2. The apparatus of claim 1, wherein the TDC is a gated ring oscillator (GRO) based TDC.

3. The apparatus of claim 1, wherein the TDC is configured to generate a measurement result indicating a time between a first event and a second event of a signal.

4. The apparatus of claim 3, wherein the TDC is further configured to provide a digital code representative of the measurement result.

5. The apparatus of claim 3, wherein the processor is configured to:
   compare the measurement result to a target value; and
   determine a non-linearity model to correct a variance of the measurement result from the target value.

6. The apparatus of claim 5, wherein the non-linearity model is implemented as a look-up table.

7. The apparatus of claim 5, wherein the non-linearity model is implemented as a polynomial function.

8. The apparatus of claim 1, wherein the phase detector comprises:
   a first input for receiving a reference clock signal;
   a second input;
   a first multiplexer coupled to the first input; and
   a second multiplexer coupled to the second input, wherein the TDC is coupled to an output of the first multiplexer and to an output of the second multiplexer.

9. The apparatus of claim 1, further comprising a filter coupled to an output of the error computation circuit and to an input of the oscillator.

10. The apparatus of claim 1, further comprising a multiplexer coupled to the output of the phase detector and to an output of the processor.

11. The apparatus of claim 1, further comprising: a state machine coupled to the phase detector and to the processor.

12. The apparatus of claim 11, wherein an output of the state machine is coupled to a control input of a first multiplexer of the phase detector, to a control input of a second multiplexer of the phase detector, and to the processor.

13. The apparatus of claim 11, wherein the phase detector comprises:
   a first multiplexer having a first input coupled to receive a reference clock signal, and a second input coupled to a first output of the state machine; and
   a second multiplexer having a first input coupled to receive a feedback signal from the oscillator, and a second input coupled to a second output of the state machine.

14. The apparatus of claim 11, wherein the state machine is configured to control a mode of operation of the phase detector.

15. The apparatus of claim 1, wherein the error computation circuit is configured to compare a measurement result from the processor to an expected result to provide a phase error signal.

16. A method, comprising:
   receiving a calibration signal;
   measuring the calibration signal to provide a measurement result, the measurement result including variance from a target value;
   processing the measurement result to determine a non-linearity model, the non-linearity model defining the variance of the measurement result from the target value;
   receiving an operating mode signal;
   measuring the operating mode signal to provide a second measurement result, the second measurement result including variance from a target value; and
   processing the second measurement result according to the non-linearity model to compensate for the variance in the second measurement result from the target value.

17. The method of claim 16, wherein the target value is a value indicative of a linear response.

18. The method of claim 16, wherein the non-linearity model is implemented as a look-up table.

19. The method of claim 16, wherein the non-linearity model is implemented as a polynomial function.

20. The method of claim 16, wherein the calibration signal and the operating mode signal are received by a gated ring oscillator (GRO) based TDC.

* * * * *